(12) United States Patent
Yang et al.

(10) Patent No.: US 9,007,778 B2
(45) Date of Patent: Apr. 14, 2015

(54) SIGNAL WIRING OF TOUCH PANEL

(75) Inventors: Kai-Ti Yang, Taoyuan (TW);
 Hsing-Ming Chang, Taoyuan (TW);
 Zhi-Wei Feng, Taoyuan (TW)

(73) Assignee: Kai-Ti Yang

( * ) Notice: Subject to any disclaimer, the term of this patent is extended or adjusted under 35 U.S.C. 154(b) by 256 days.

(21) Appl. No.: 13/572,706

(22) Filed: Aug. 13, 2012

(65) Prior Publication Data

US 2014/0043776 A1 Feb. 13, 2014

(51) Int. Cl.
 *H05K 1/00* (2006.01)
 *G06F 3/044* (2006.01)
 *H05K 1/02* (2006.01)
 *H05K 1/11* (2006.01)

(52) U.S. Cl.
 CPC .............. *H05K 1/0289* (2013.01); *G06F 3/044* (2013.01); *G06F 2203/04103* (2013.01); *H05K 1/118* (2013.01)

(58) Field of Classification Search
 CPC ..... H05K 1/0296; H05K 1/0298; H05K 1/03; H05K 1/0306; H05K 1/0313; H05K 1/038; H05K 1/0393; H05K 1/11; H05K 1/111; H05K 1/117; H05K 1/14; H05K 1/141; H05K 1/18; H05K 1/181; H05K 1/189
 USPC ................... 361/679.01, 728, 746, 748–750; 174/250, 254–257
 See application file for complete search history.

(56) References Cited

U.S. PATENT DOCUMENTS

2013/0043081 A1\* 2/2013 Chen .......................... 178/18.05

\* cited by examiner

*Primary Examiner* — Tremesha S Willis

(57) ABSTRACT

A signal wiring of a touch panel mainly extends a bonding portion of a touch sensing unit from a signal wire on a substrate outside the substrate. The bonding portion is further attached to a signal bus so as to shrink the wiring area of the touch sensing unit and the edge frame as well. The bonding portion outside the substrate is allowed to be formed larger for improving improving the stability and yield of the connection between the touch sensing unit and the signal bus.

3 Claims, 2 Drawing Sheets

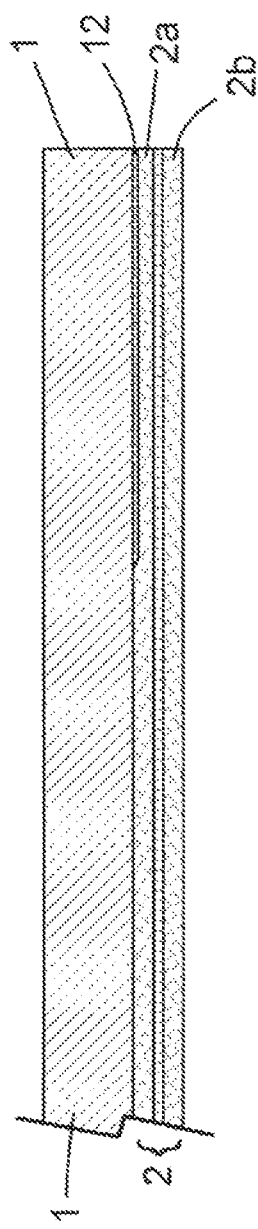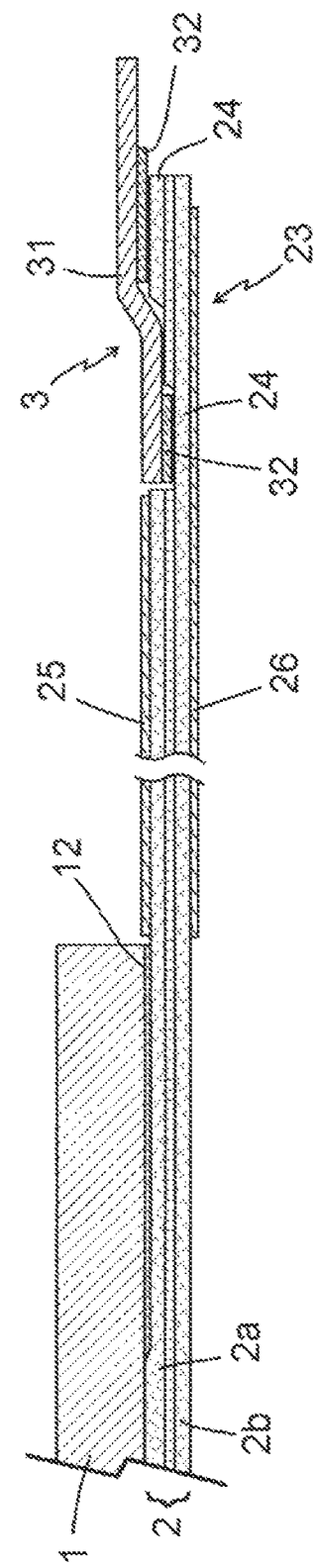

SIGNAL WIRING OF TOUCH PANEL

FIELD OF THE INVENTION

The present invention relates to touch panel, and particular to a signal wiring for a touch panel.

DESCRIPTION OF THE PRIOR ART

Touch panels mainly include a transparent substrate having a touch sensing unit on the substrate. The center of the substrate is a touch sensing area and the edge of the substrate is an area for wiring electrically connected to the touch sensing unit. A bonding portion is formed to one of a wider wiring area. The bonding portion has a plurality of signal node electrically connected to all the signal wire. The boning portion serves to be attached to a signal bus for transferring signal induced by the touch sensing unit to a signal processing circuit. Such touch panels are attached in front of a LCD or LCM with bending the signal bus to the rear side of the LCD and LCM.

Modern electronic products are usually equipped with thin display panel. To increase the operation area of a touch panel, the edge for wiring is compressed for increase touch sensing area of the panel. However, the wiring layout especially the bonding portion for the wiring will become more critical in manufacturing, production, and the yield. A shrink bonding portion could also lead to connection problem and signal transferring lose. Moreover, previous bonding portion locates just below the edge of the substrate, the installation of the touch panel could be jammed by the thickness of the bonding portion which is usually higher than 0.15 mm. The edge of the touch panel also suffers external forces applied to the panel so that the boding portion under the edge of the panel could be damaged easily.

SUMMARY OF THE PRESENT INVENTION

Accordingly, the primary object of the present invention is to provide a signal wiring for a touch panel. The signal wiring mainly extends a boding portion of a touch sensing unit from a signal wire on a substrate outside the substrate. The bonding portion outside the substrate is further attached to a signal bus so as to shrink the wiring area of the touch sensing unit and the edge frame as well. The bonding portion outside the substrate won't cause protrusion, stress, and installation issue to the touch panel.

The bonding portion outside the substrate is allowed to be formed larger for improve the stability and yield of the connection between the touch sensing unit and the signal bus.

At least one of the upper or the lower surfaces of the bonding portion has a bonding pad arranged to the surface. The bonding pad could protect the signal node or signal wire from being scratched. The bonding pad could also protect the bended wiring from being over bending or broken. The bonding pad are made of PC or PET plate with a thickness lower than 60 um.

The various objects and advantages of the present invention will be more readily understood from the following detailed description when read in conjunction with the appended drawing.

BRIEF DESCRIPTION OF THE DRAWINGS

FIG. 3 is a cross-section view showing the assembly of the touch panel of the present invention, and FIG. 4 is a cross-section view showing the bonding portion of the present invention.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 2:
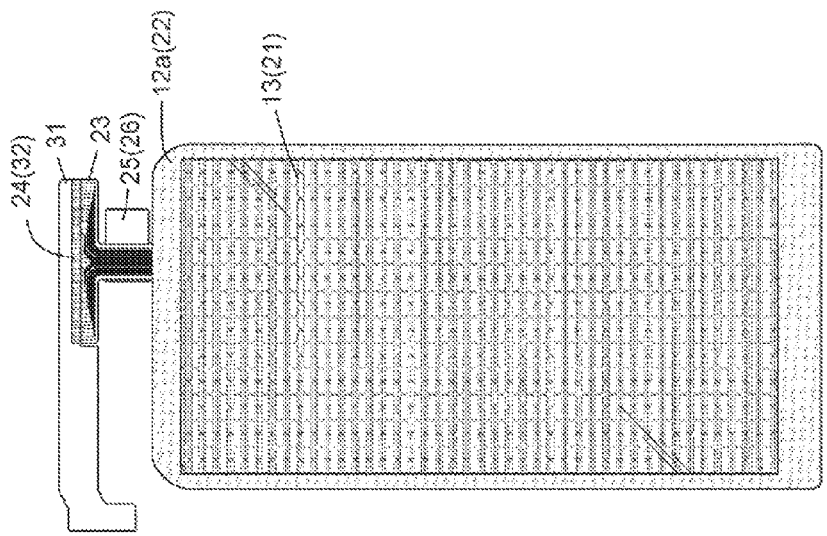
FIG. 2 is a top view showing the present invention.
Figure 1:
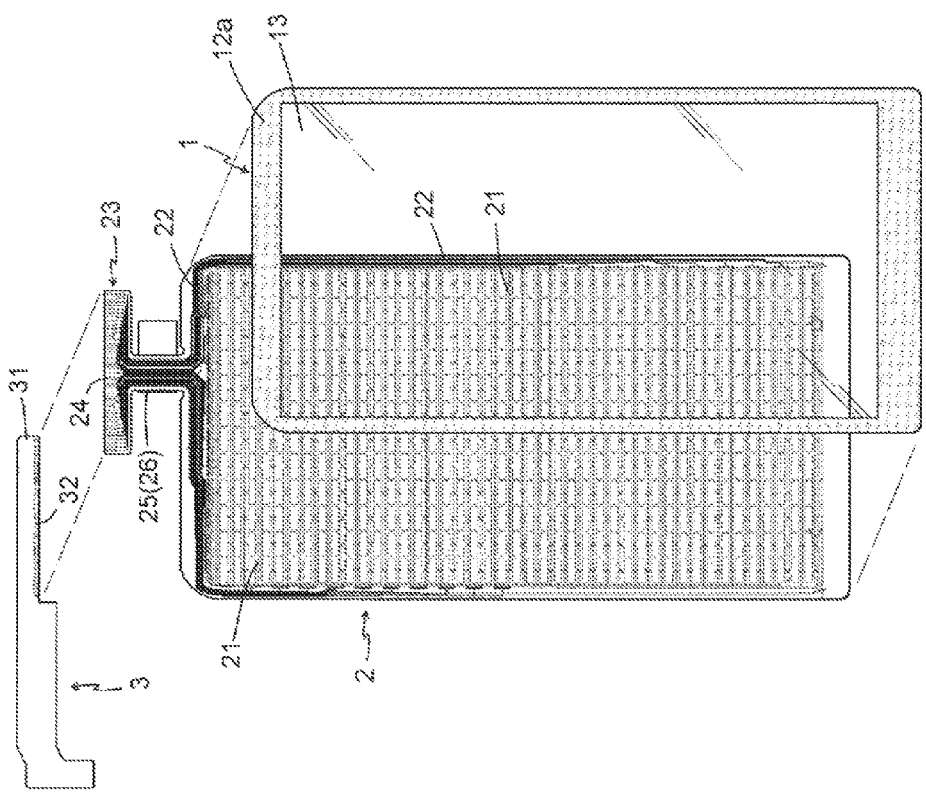
FIG. 1 is a schematic view showing installation of the present invention.

Referring to FIGS. 1 to 4, a preferable embodiment of the present invention mainly includes a transparent substrate 1, transparent touch sensing unit 2, and a signal bus 3. The transparent substrate 1 is a high transparent plate with good mechanical strength made of glass, polymethyl methacrylate (PMMA), polycarbonate (PC), polyester (PET), Cyclo-Olefin Copolymers (COC), or other material. A color frame 12 is arranged around the edges of a bottom surface of the transparent substrate 1. The color frame 12 is an opaque thin film made of insulated material. The insulated material can be ink, photoresist or other material. The film of the color frame 12 with a thickness about 15μm is formed by printing or coating. The width of the film is usually smaller than 3mm for meeting the needs for narrow-edge panel design. A visible area 13 and shelter area 12a covered by the color frame 12 are thus formed to a center and the edge of the transparent substrate 1 respectively as shown in FIGS. 1 and 2.

In the embodiment of the present invention, the transparent touch sensing unit 2 has an upper capacitive sensing layer 2a and a lower capacitive sensing layer 2b which are insulated from each other. The capacitive sensing layers 2a and 2b are transparent Indium Tin Oxide (ITO) patterned films formed to the bottom surface of the transparent substrate 1 through etching process or laser process. The transparent touch sensing unit 2 including a plurality of transparent touch sensing components 21 is arranged to the bottom surface, within the visible area 13 of the substrate 1. A plurality of signal wires 22 electrically connected to the touch sensing component 21 are formed to the edge of the substrate 1 within the shelter area 12a. A bonding portion 23 extending outside the substrate 1 is formed to the shelter area 12, the bonding portion includes a plurality of signal nodes 24 which electrically connected to the plurality of signal wire 22 respectively. A bonding pad 25 and 26 are arranged to the upper and the lower surfaces of the bonding portion 23. The bonding pads 25, 26 are PET plate of 50um thickness sticking to the bonding portion 23 through optical glue.

The signal bus 3 is a flexible printed circuit (FPC) having a flexible plate 31. A plurality of electric nodes 32 is formed to the bottom surface of the flexible plate 31 and a plurality of electric wires (not shown) connected to the node 32. The signal bus 3 is attached to the bonding portion 23 so that the electric node 32 of the signal bus 3 is electrically connected to the signal node 24 of the bonding portion 23 as shown in FIG. 4. Therefore, a sensing signal induced by the touch sensing unit 2 can be transmitted to a following signal processing circuit (not shown) through the signal bus 3. The title can be applied to a Liquid Crystal Display Module (LCM) by attaching the touch panel in front of the LCM with winding and attaching the extending bonding portion 23 and signal bus 3 behind the LCM. The above embodiment is applied to a capacitive touch panel for example, the present invention can be also applied to other touch panels such as a resistive or electromagnetic touch panel.

The present invention is applied to a narrow-edge panel by separating the bonding portion 23 from the signal wire on the substrate 1 so as to reduce the area for signal wire and the frame as well. On the other hand, the area for touch sensing unit can be enlarged. Moreover, the connection junction between the bonding portion 23 and signal bus 3 is outside the edge of the panel so as to stay away from the force applied to the panel. Without the bonding portion arranged on the bottom side of the substrate 1, the bottom surface of the substrate 1 is flat to be arranged to the LCD/LCM. The bonding portion 23 can be also formed larger to improve the stability and yield of the bonding.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A signal wiring of a touch panel comprising: a transparent substrate having an insulated color frame on an edge of a bottom surface thereof; a visible area and shelter area covered by the color frame being formed to a center and an edge of the transparent substrate respectively; a transparent touch sensing unit arranged to a surface of the transparent substrate; a touch sensing area on a center of the visible area having a plurality of touch sensing components; a wiring area on the shelter area having a plurality of signal wires electrically connected to the plurality of touch sensing components; the wiring area having a bonding portion extending outside the substrate; the bonding portion having a plurality of signal nodes electrically connected to the plurality of signal wires; and a signal bus having a flexible substrate which is separated from and not in contact with the transparent substrate, the flexible substrate having a plurality of electric nodes and a plurality of electric wires electrically connected to the plurality of electric nodes; the signal bus being attached to the bonding portion so that the plurality of electric nodes is electrically connected to the plurality of signal nodes of the bonding portion.

2. The signal wiring of a touch panel as claimed in claim 1, wherein at least one of the upper and a lower surface of the bonding portion has a bonding pad.

3. The signal wiring of a touch panel as claimed in claim 2, wherein the bonding pad is a PET or a PC plate with a thickness under 60 μm.

* * * * *